United States Patent [19]

Zeiger

[11] Patent Number: 4,607,226

[45] Date of Patent: Aug. 19, 1986

[54] MEASURING HEAD AND A METHOD FOR RECORDING HIGH-RESOLUTION NUCLEAR RESONANCE SIGNALS

[75] Inventor: Heinz Zeiger, Karlsruhe, Fed. Rep. of Germany

[73] Assignee: Brunker Medizentechnik GmbH, Forchheim, Fed. Rep. of Germany

[21] Appl. No.: 670,642

[22] Filed: Nov. 13, 1984

[30] Foreign Application Priority Data

Nov. 19, 1983 [DE] Fed. Rep. of Germany ....... 3341802
Dec. 2, 1983 [DE] Fed. Rep. of Germany ....... 3343625

[51] Int. Cl.$^4$ .......................................... G01R 33/20
[52] U.S. Cl. .................................. 324/318; 324/300; 324/322
[58] Field of Search ............... 324/300, 309, 307, 318, 324/319, 320, 321, 322, 316; 128/653

[56] References Cited

U.S. PATENT DOCUMENTS

| | | | |
|---|---|---|---|
| 3,242,424 | 3/1966 | Redfield | 324/322 |
| 3,599,120 | 8/1971 | Thibault | 324/318 |
| 4,398,149 | 8/1983 | Zens | 324/316 |
| 4,439,733 | 2/1984 | Hinshaw | 324/322 |
| 4,517,516 | 5/1985 | Hill | 324/318 |

OTHER PUBLICATIONS

Paper pub. by Alger, et al.–published in "Science", vol. 214, Nov. 6, 1981, pp. 660-662.
Article by James Fisk, "Helical-Resonator Design Techniques", pub. Jun. 1976, pp. 11-14.
Article by Csakvary, et al., pub. in "The Review of Scientific Instruments", vol. 39, No. 11, Nov. 1968, pp. 1600-1665.

Primary Examiner—Michael J. Tokar
Attorney, Agent, or Firm—Kokjer, Kircher, Bradley, Wharton, Bowman & Johnson

[57] ABSTRACT

A measuring head serves for recording high-resolution nuclear resonance measurements in small defined areas of organic tissue of human or animal bodies which are exposed to a homogenous magnetic field. To this end, there is placed upon the body an RF transmitting and receiving device consisting of a helical line 20 with a shielding 23 wherein the shielding (23) is open on at least one end (25) and the helical line 20 is connected at the said end 25 with the shielding 23, and wherein finally the open end 25 forms the application plane 27. Further, methods are proposed for recording high-resolution nuclear resonance spectra by means of such a measuring head 12.

14 Claims, 5 Drawing Figures

MEASURING HEAD AND A METHOD FOR RECORDING HIGH-RESOLUTION NUCLEAR RESONANCE SIGNALS

The present invention starts out from a measuring head for high-resolution nuclear resonance measurements in defined areas of organic tissue of human or animal bodies which are exposed to a homogenous magnetic field, comprising a RF transmitter and receiver unit suitable for being applied upon the body. Further, the present invention starts out from methods for recording high-resolution nuclear resonance signals in such areas.

A measuring head of the before-mentioned type has been described in a paper by Alger et al. published in the journal "Science", vol. 214, Nov. 6, 1981, pages 660 to 662.

The term "defined areas" will be used hereafter to describe small surface areas or areas close to the surface of the bodies, as opposed to the measurements taken on the entire body as known in nuclear spin tomography. The size of the "defined area" depends largely on the geometry of the particular measuring head used, because measurements can be taken only in the proximity of the plane of application of the measuring head to the body.

The use of the examination method employing nuclear resonance and also high-resolution nuclear resonance for diagnostic purposes has been known heretofore. In all these cases, the body or part of the body of a patient to be examined is introduced into a magnet system which generates a sufficiently homogenous constant magnetic field in a macroscopic area of the body or part of the body.

In order to excite the nuclear resonance, one must irradiate, in a direction vertical to the constant magnetic field, an additional RF magnetic field of a frequency which, relative to the strength of the constant magnetic field, is fixed for different nuclear species as a natural constant.

In the case of the so-called nuclear spin tomographs, the RF magnetic field is generated by large saddle-shaped coils so that the cross-sectional images of the bodies or parts of the bodies of patients desired in nuclear spin tomography can be produced. This generation of large RF magnetic fields may, under certain circumstances, result in the body or part of the body of the patient being excessively heated up by the RF radiation; on the other hand, it is a drawback of large RF arrangements that in the case of high RF field strengths, disturbing radiation may leak out and interfere with nearby measuring equipment, while on the other hand interfering radiation may also enter from the outside and lead to distortions of the measuring results.

For this reason it has been known, for example from the before-mentioned publication, to replace the saddle coils by small surface coils which are applied to an interesting area of the body. If examinations are to be carried out on organs located deeper in the body one exposes, for example in animal experiments, the organ to be examined (liver) and applies the coil directly on the organ. Frequently, however, the areas of interest are surface areas or at least areas close to the surface of the body to be examined so that the small surface coil arrangements are sufficient which neither have any detrimental effects on the patient due to excessive RF radiation, nor cause any excessive disturbing radiation, nor are sensitive to external disturbing radiation.

Accordingly, such surface coils are used in all cases where no samples can be taken and where measurements are to be carried out on live bodies (so-called in-vivo measurements) in a relatively simple manner and where, on the other hand, it is not possible or not desirable to introduce the whole body or part of the body into a sample head.

From a paper by Volino et al. published in "Review of Scientific Instruments", vol. 39, No. 11, 1968, pages 1660 to 1665, there have been known helix resonators for electron spin resonance measurements taken in the microwave range (X band). One uses in such measurements a sample tube which fills the entire interior of the helix; but it is also possible to dip the whole helix in a liquid. Due to the transient wave propagating in the helix, the whole interior of the helix is practically filled with components of the electric field so that the introduction of a sample produces a drastic reduction of the quality of the helix resonator which is anyway rather low. For, the quality of the empty helix is already lower than that of usual cavity resonators, and the sensitivity loss thus obtained can be compensated in the case of the helix resonator only to a certain degree by filling the helix completely in order to increase the space factor, compared with a cavity resonator. In any case, it is necessary with a helix resonator of this type to fill the entire interior of the helix with sample material. But this is not possible in the case of in-vivo measurements on live bodies. In addition, the known helix resonator does not provide for the utilization of the external field, and separating the magnetic from the electric field areas is neither provided nor even possible with the samples of finite dimensions with which we are dealing here.

Form a paper by Fisk published in the journal QST, June 1976, pages 11 to 14, it has been known that for amateur radio purposes helix resonators can be used in which the helix is enclosed by a coaxial shielding that may be open on both ends. These resonators serve exclusively as filters and have, consequently, no "transmitting" or "receiving properties". As usual in radio technology, one takes great care to prevent any flux lines from penetrating into the external area of the resonator. One achieves this by either closing the shielding on both ends with a conductive bottom so that the helix is surrounded on all sides by a closed conductive case, or else by extending the coaxial shielding in the axial direction a sufficient length beyond the ends of the helix so that only negligibly components of the leakage field of the helix are permitted to leak out. This renders the use for surface measurements of the type described above impossible because, by definition, flux lines do not and, in effect, must not leak out in the case of these known helix resonators. And there are of course no arrangements to provide for areas of high magnetic and low electric field strength.

When regarding surface coils employed for nuclear resonance measurements of the type described above more closely, one realizes that these surface coils offer quite a number of systematic disadvantages:

One substantial disadvantage resides in the fact that such simple surface coils do not provide for a physical separation between the electric and the magnetic field. However, to excite nuclear resonances, the body area to be examined has to be exposed only to the magnetic RF field, while the electric RF field need not be applied. In effect, the application of the electric RF field is even undesirable because dielectric losses in the body would impair the sensitivity of the measuring head.

Another disadvantage of the surface coils is their relatively narrow band width so that different measuring heads with different surface coils are required for exciting different nuclear species. However, any change of the sample head will as a rule also entail a change of the measuring point—especially with nervous patients—so that when measuring different nuclear species in succession, the measuring results obtained may no longer be comparable. Consequently, it is also not possible to trim the equipment initially with the aid of a first nuclear species providing relatively strong nuclear resonance signals, and to proceed thereafter to measuring the interesting nuclear resonance spectrum of another nuclear species.

It is a further disadvantage of the known surface coils that inspite of their small dimensions, compared with the saddle coils mentioned before, they still show a certain residual radiation and, thus, a certain sensitivity to disturbing radiation.

It is a known fact that in usual nuclear spin tomography, i.e. the image representation of body cross-sections, a homogeneity of the constant magnetic field of $10^{-5}$ can be deemed sufficient, while in the case of externally applied measuring heads for recording high-resolution nuclear resonance spectra a homogeneity of at least $10^{-7}$ is required. It is therefore necessary, when measuring such high-resolution nuclear resonance spectra, to obtain a homogeneous constant magnetic field at the measuring point, i.e. in the area of the body or part of the body of the patient, before commencing the measurement. However, this adjustment should be made as quickly as possible to avoid excessively long examination times for the patient and also to permit economically sound utilization of the equipment.

Finally it has also been known that when measuring one nuclear species the information value of the nuclear resonance spectra can be improved by "decoupling" another nuclear species, i.e. exciting or saturating it simultaneously by another strong RF field. One usually decouples protons while measuring other nuclear species. However, decoupling requires high RF power so that an increased risk of interferences of an electric nature is encountered when using the before-mentioned known arrangements with saddle coils and surface coils. It is, therefore, desirable that such decoupled experiments be feasible also with measuring heads applied to the body surface.

Now, it is the object of the present invention to permit measurements of the type described at the outset in which the body area of interest is practically exclusively passed by the magnetic RF field in which different nuclear species can be measured without changing the measuring head and in which, finally, a minimum of disturbing radiation is emitted so that the measurements are insensitive to disturbing external radiation.

According to the invention, this object is achieved on the one hand by a measuring head in which the device takes the form of a helical line with coaxial shielding, in which the shielding is open on at least one end and the other end of the helical line is free of any connection, and in which finally the uppermost winding of the helical line which is connected with the shielding via a connection is located substantially in the plane of the upper open end where it forms the application plane.

Thus, the measuring head of the invention offers the advantage that the flux lines leaking out from the helical line are predominantly magnetic ones, while the electric flux lines close predominantly between the helical line and the shielding, i.e. in its interior so that only minor components are permitted to leak out. Thus, only very minor electric losses are encountered in the body area under examination. Another advantage of the invention is to be seen in the fact that the structure of the helical line permits the latter to be excited in several oscillation modes at different frequencies, so that the measuring head of the invention can be used in a broad frequency range which permits nuclear resonances of different nuclear species to be excited without the need to change the measuring head. It is therefore possible, once the measuring head has been applied to the body, to measure nuclear resonance spectra of different nuclear species in direct succession. This ensures on the one hand that the spectra of different nuclear species are measured in exactly the same body areas and that, on the other hand, the entire measurement can be completed within a minimum of time. This latter advantage results also in considerable economical advantages because nuclear resonance appliances for medical diagnosis are very expensive so that it is of course desirable to amortize their cost by the greatest possible number of measurements. If the measuring head of the invention is given a suitable size, it may be introduced into a body, after the latter has been opened for example by surgical means, and applied on an exposed organ. And in animal experiments, an organ may for example be exposed in such a manner that it can be placed upon a measuring head cover.

Finally, the measuring head of the invention offers the additional material advantage that due to the shielding enclosing the helical line practically no disturbing radiation can leak out, in particular because the electric flux lines close within the shielding, and that, analogously, no disturbing radiation leaking in from the outside can disturb the measuring results, in particular because electric coupling of the closed flux lines within the shielding from the outside is practically excluded.

On the other hand, the before-mentioned object of the invention is achieved by the before-mentioned method by the steps of using a measuring head of the described type, exciting initially in the helical line an oscillation mode of a higher frequency at which nuclear resonances of protons ($H^1$) are encountered, optimizing the homogeneity of the constant magnetic field while observing one line of the nuclear resonance spectrum of protons, and exciting thereafter an oscillation mode of a low frequency at which nuclear resonances of other nuclear species, in particular $C^{13}$, $P^{31}$, $Na^{23}$, are encountered, and measuring finally the nuclear resonance spectrum of the other nuclear species.

Accordingly, one makes use of the advantageous feature of the measuring head of the invention that it permits broadband excitation in different oscillation modes, if necessary with simultaneous individual trimming of the frequencies of the different oscillation modes, so that the excitation frequency can be switched over by a simple electric switching action from proton resonance to the resonance of another nuclear species. Proton spectra are particularly well suited for homogenizing the magnetic field because the increasing homogeneity of the magnetic field has a direct effect on the lineshape of the spectra and because in the presence of strong signals the spectrum can be observed after each individual excitation so that the magnetic field can be homogenized continuously. This is a material advantage compared with the field homogenization with other nuclear species because measuring of the nuclear resonance spectrum of another nuclear species requires for example several minutes so that the constant magnetic field can be readjusted for homogenization purposes only at intervals of several minutes which would result in a very long trimming period for the entire appliance.

The before-mentioned object of the invention is finally achieved by the above method of the invention by the steps of using a measuring head of the described type, applying a RF field to the area, in particular for exciting proton resonances by means of RF surface coils (saddle coils), and applying the measuring head on the body in a direction vertical to the plane of the surface coils, in particular for measuring other nuclear species.

Accordingly, this step makes use of the favorable dimensions of the measuring heads of the invention in that the measuring head of the invention is introduced in a simple manner into a normal nuclear spin tomograph and applied in addition to the saddle coils provided therein and in vertical direction thereto. The arrangement of the coil axes at an angle of 90° relative to each other and the specific shielding properties of the measuring head of the invention ensure in this case that no or practically no disturbing radiation is transmitted from the saddle coils to the measuring head.

The end of the helical line opposite the plane of application may have different shapes. In a so-called λ/2 arrangement, for example, a mirror-symmetrical structure would be obtained in which the end opposite the application end would be identical in design to the latter. In a preferred embodiment, however, a so-called λ/4 structure is used which means that the other end of the coaxial shielding is closed. This embodiment of the invention is particularly advantageous because by closing the shielding at the opposite end a further improvement of the shielding properties is obtained. In addition, this arrangement gives a particularly short length in the axial direction, and this is particularly advantageous because the measuring head of the invention has to be placed on the body under examination in a direction vertical to the direction of the constant magnetic field, i.e. vertical to the axis of a solenoid magnet system, and there is relatively little space available within the solenoid magnet system in this direction vertical to the axis of the constant magnetic field.

Further an embodiment is preferred, in which the open end forming the application plane is covered by a cover made of an electrically non-conductive material and provided with a plurality of radially extending conductive paths the outer ends of which end in a housing forming the shielding while their inner ends meet at the center of the cover without, however, contacting each other.

This measure offers the advantage that the feeble electric RF leakage field still present is short-circuited by the conductive paths above the application plane, whereby dielectric losses in the body and interference by disturbing radiation leaking in or out are still further reduced.

According to the invention, there is further provided a first tuning arrangement in which the distance between the free end of the helical line and the other closed end of the coaxial shielding can be varied.

This measure offers the advantage that tuning to the desired resonance frequency can be effected in a particularly easy manner when a λ/4 resonator is used, i.e. with the lowest possible resonance frequency of the basic oscillation mode. Tuning is effected in this case at the "open end" by approaching a metallic disk, in particular in the form of a bottom corresponding to the radial crosssectional shapes of the shielding. It goes without saying that instead of approaching a metallic disk, immersing a metallic cylinder or connecting a capacitor as a concentrated component in the conventional manner is also possible.

In another preferred embodiment of the invention, a further tuning arrangement is provided in which the electric field generated by the helical line is loaded at an axially defined point where the electric field reaches its maximum only for one pre-determined oscillation mode.

This measure offers the particular advantage that frequency tuning can be effected independently for the individual oscillation modes. An oscillation mode of a higher frequency has for example several electric field strength maxima which means that some of these maxima occur at points where no maxima are encountered for an oscillation mode of a lower frequency. By loading the electric field at the point where maxima are encountered only for oscillation modes of a higher frequency one may for example reduce the frequency of the higher oscillation mode without thereby influencing the resonance frequency of the lower oscillation mode. In this manner, it is possible to adjust the frequency ratio of the different oscillation modes in a manner different from the non-even multiples that would theoretically be obtained so that different resonance frequencies are obtained in the measuring head which correspond to the nuclear resonance frequencies of different nuclear species, the frequency ratio of different nuclear species being a natural constant which, as is generally known, does not correspond to uneven multiples.

The tuning arrangement may conveniently be interposed between the helical line and the shielding. To this end, it may consist of an electrically conductive lug, which has its one end connected to a housing forming the sheathing and whose other end can be radially deflected. In this manner, loading of a maximum of the electric field strength can be effected simply by turning a screw.

Another possibility to provide for such selective tuning of a maximum of the electric field strength is obtained when arranging the tuning arrangement in the interior of the helical line. The tuning arrangement consists in this case preferably of an open loop whose plane extends transversely to the axis of the helical line and which has its one end connected to the housing forming the sheathing.

This latter tuning arrangement is particularly well suited for adjusting a fixed pre-determined basic load.

For optimizing the adaptation of the measuring head to the supply line an embodiment is preferred in which a further tuning arrangement, preferably in the form of a variable capacitor, is provided in the connection between the helical line and the shielding. This measure offers the advantage that the supply line which is passed through the shielding housing in insulated manner can be connected by soldering directly to the open end of the helical line and that fine tuning is then effected by means of the variable capacitor so that the characteristic impedance can be exactly adjusted to, say, 50 Ω.

In a further preferred improvement of the invention, the helical line is connected to an RF transmitter of variable amplitude.

This measure offers the following surprising advantage:

Those flux lines of the magnetic RF field which emanate from the open end of the measuring head and enter the body under examination lead to a field strength distribution of the RF magnetic field in the body under examination in which the intensity of the magnetic RF field decreases from the surface towards the interior of the body. By adjusting the amplitude of the magnetic RF field one can now create a condition in which a magnetic RF field strength of a value meeting exactly the so-called 90° requirement is encountered, i.e. a maximum signal yield is obtained at a certain depth beneath the surface of the body under examination because the spins of the nuclear species to be examined are rotated out of their normal position by 90° when the magnetic RF field is applied. Other areas of the body under examination are in contrast subjected to a magnetic RF field which satisfies approximately the so-called 180° requirement so that practically no signals are obtained from these areas.

Thus, the body areas to be examined can be selected in depth by adjusting the amplitude of the magnetic RF field.

Other advantages of the invention are apparent from the specification and the attached drawings.

Hereafter, the invention will be described in detail with reference to the drawings in which.

Figure 1:
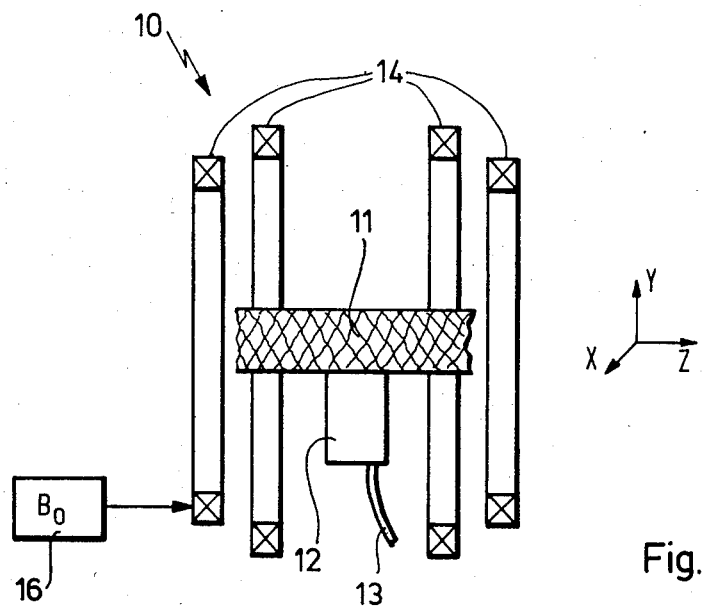
FIG. 1 is a diagrammatic three-dimensional representation of a spectrometer arrangement using the measuring head of the invention.

In FIG. 1 a magnet system arranged in a space defined by the space coordinates x, y, z is generally designated by the reference number 10. The space coordinate z coincides with the axis of the magnet system 10. Extending along the axis z, there can be seen a sample 11 in diagrammatic representation which sample may for example consist of the body or part of the body of a patient, for example an arm or a leg. It goes, however, without saying that the measuring head of the invention can be used also for anorganic samples and for individual samples of live or non-living tissue.

A supply line 13 leads from the measuring head 12 to an electronic arrangement not shown in FIG. 1.

The magnet system 10 is indicated only schematically. It consists of a so-called double Helmholtz arrangement comprising two pairs of Helmholtz coils 14. The Helmholtz coils 14 generate in the interior a constant magnetic field of high homogeneity in all three space coordinates x, y, z. This means that nuclear resonance would occur in the whole area of homogeneity if a magnetic RF field were simultaneously radiated upon the sample 11 in transverse direction to the coordinate z.

Figure 2:
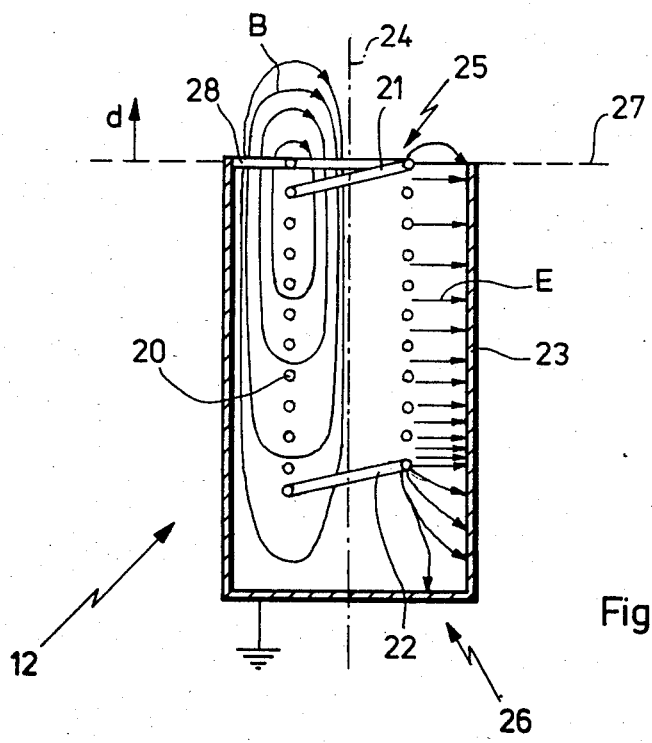
FIG. 2 shows a schematic cross-sectional representation of a measuring head according to the invention illustrating the field distribution obtained.

FIG. 2 shows the field distribution in a measuring head 12 according to the invention.

The measuring head 12 consists substantially of a helical line 20 of the type usually called "helix" in technical literature. For better clarity, only the uppermost winding 21 of the helical line 20 and the lowermost winding 22 are shown completely in FIG. 2. The second essential element of the measuring head 12 of the invention consists in an earthed shielding 23 which in one embodiment extends for example coaxially around the helical line 20. The shielding 23 as it extends along its longitudinal axis 24 comprises an upper open end 25 and a lower closed end 26. In the embodiment shown in FIG. 2, the helical line 20 extends along the axis 24 in such a manner that the upper winding 21 which is connected with the shielding 23 through a connection 28 is located approximately in the plane of the upper open end 25 where it forms an application plane 27, i.e. the plane by which the measuring head 12 is applied on the sample 11 under examination.

From the electrical point of view this means that the upper end 25 of the helical line 20 is connected with the shielding 23 and, thus, to earth via the connection 28, whereas in the area of its lowermost winding 22 it is electrically open at a distance from the lower closed end 26 of the shielding 23.

Thus, the field distribution as shown in FIG. 2 is obtained, where the half to the left of the axis 24 showing the magnetic flux lines is designated generally by the letter B, while the half to the right of the axis 24 showing the electric flux lines is designated generally by the letter E. It can be seen that the magnetic flux lines B close in a radial plane of the helical line 20 and extend outwardly, in particular above the open end 25. Now, when the measuring head 12 is placed on the sample 11 by its application plane 11, the distribution of the magnetic flux lines B obtained is such that the intensity of the magnetic field decreases towards the center of the sample 11, along a coordinate d in FIG. 2.

On the other hand, the electric flux lines E are found substantially in the space between the helical line 20 and the shielding 23 so that they practically do not make themselves felt externally. There are hardly any leakage fields of the electric flux lines E encountered in the area above the application plane 27. In addition, the E flux line density decreases from the bottom to the top.

The electric diagram shown in FIG. 2 represents a so-called λ/4 resonator with a closed lower end 26 of the shielding 23. It goes, however, without saying that instead of using the arrangement shown in FIG. 2, one could also employ a so-called λ/2 resonator in which case the arrangement shown in FIG. 2 would be cut off in the radial direction substantially in the plane of the lowermost winding 22 of the helical line 20 and the lower end of the remaining upper portion of the arrangement shown in FIG. 2 would be followed on its lower end by a mirror-symmetrical part which would in turn end in a configuration identical to the upper open end 25. However, it can be easily seen that the arrangement according to FIG. 2 comprising a λ/4 resonator is much shorter in length and, in addition, completely shielded at the bottom so that normally it should be more convenient for measuring nuclear resonance spectra within a magnet system 10.

Figure 3:
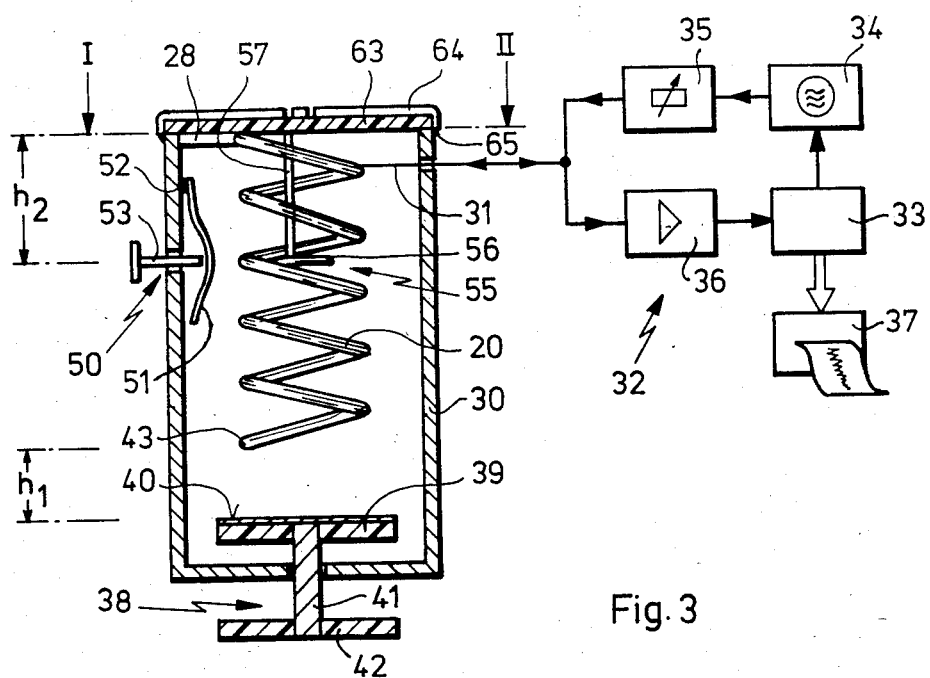
FIG. 3 shows a cross-section through one practical example of a measuring head according to the invention, in connection with the necessary electronic evaluation units.

FIG. 3 shows a practical example of a measuring head 12 of the type shown in FIG. 2 in diagrammatic form. In the example shown in FIG. 3, the shielding 23 consists of a cup-shaped housing 30 made of a conductive material. A line 31 is passed in insulated manner through the wall of the housing 30 near its upper edge and connected, for example by soldering, to the helical line 20. The line 31 is connected to an electronic measuring arrangement generally indicated in FIG. 3 by the reference number 32. The electronic system 32 comprises first of all a control unit 33 controlling the different transmission and receiving functions, the data processing functions and the output of the measuring results. The unit 33 controls for example an RF transmitter 34 whose output can be varied through an attenuator 35 or a variable output stage. The receiving section comprises on the other hand a receiving amplifier 36 whose output leads to the control unit 33. Finally, the control unit 33 is further connected to a recorder 37 or a similar indicating unit such as a screen.

Figure 4:
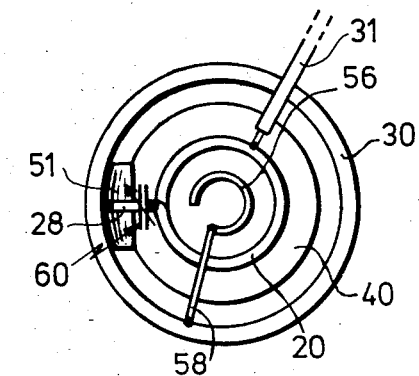
FIG. 4 shows a top view of the embodiment of FIG. 3, in plane I-II.

As can be seen, in particular in connection with FIG. 4, there are a total of four tuning arrangements provided on the measuring head 12 of the invention.

The first tuning arrangement 38 consists substantially of a bottom 39 made of an electrically non-conductive material, but provided with an electrically conductive coating 40. A threaded rod 41 mounted on the bottom 39 is connected conductively with the coating 40 and passed outwardly through a threaded bore in the bottom of the housing 30 to a wheel 42 which can be turned manually so that when the threaded rod 41 is screwed further into the bottom of the housing 30, the electrically conductive coating 40 of the bottom 39 is displaced in the axial direction of the housing 30. By varying the distance $h_1$ between the electrically conductive coating and the lower free end 43 of the helical line 20 one can tune the resonance frequency of the basic oscillation mode, i.e. the lowest frequency at which the measuring head of the invention is capable of resonating.

A second tuning arrangement 50 consists of an electrically conductive lug 51 which has its one end 52 conductively connected to the inside of the housing 30, for instance by soldering. By screwing in a radially extending screw 53 through the housing 30, the central area and/or the free end of the lug 51 can be deflected in the radial direction.

The screw 53 is provided at a distance $h_2$ from the upper edge of the housing 30.

A third tuning arrangement 55 is active at the same distance $h_2$ from the upper edge of the housing 30. This third tuning arrangement 55 consists of an open loop 56 arranged in a radial plane relative to the helical line 20. An axially extending line 57 and a bent-off radially extending line 56 provide a permanent, for example soldered, connection between the inside of the housing 30 and the open loop 56 which is thereby earthed.

The system formed by the helical line 20 and the shielding housing 30 is capable of resonating at different oscillation modes. Apart from the before-mentioned basic mode, there are a plurality of other higher oscillation modes with correspondingly higher resonance frequencies. In the case of these higher oscillation modes, a plurality of electric field strength maxima is encountered along the longitudinal axis of the housing 30 and/or the helical line 20. These additional maxima do not occur at lower oscillation modes, in particular not at the basic mode. Now, the distance $h_2$ corresponds to that distance which one electric field strength maximum has in the axial direction from the upper edge of the housing 30. With the aid of the second tuning arrangement it is now possible to load the maximum of the higher oscillation mode continuously by screwing in the screw 53, while the third tuning arrangement represents a constant load. Accordingly, the resonance frequency of the higher oscillation modes can be reduced by one of the tuning arrangements 50, 55, or both, so as to adjust a ratio between the resonance frequency of the higher oscillation mode and that of the basic mode different from the theoretical value of an uneven multiple. For example, the ratio may be adjusted to correspond to the ratio of the resonance frequencies of different nuclear species, for example protons on the one hand and the isotope C13 of carbon on the other hand, i.e. approx. 80 MHz for $H^1$ and 20.1 MHz for $C^{13}$.

As mentioned before, coupling of the helical line is effected via the line 31 which is insulated from the housing 30 and whose free end is soldered to the uppermost winding 21 of the helical line 20. As can be seen best in FIG. 4, the connection point of the line 31 and the connection point of the earth connection 38 are offset relative to each other by a specific angle about the circumference of the uppermost winding 21. Since the tuning effect that can be achieved by defining this angle is only relatively rough, fine tuning can be effected by a forth tuning arrangement 60 which may in particular consist of a variable capacitor arranged in the supply line or at the point of the short circuit so that, viewed from the outside into the line 31, there exists a defined terminal resistance, for example a characteristic impedance of 50Ω. Instead of using a single capacitor as the forth tuning arrangement 60, one may of course also use a number of capacitors connected in parallel which practically represent a short circuit for the high frequency employed.

Figure 5:
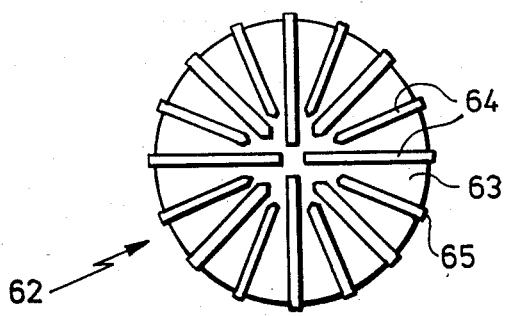
FIG. 5 shows a top view of the embodiment of a measuring head of the invention shown in FIG. 3.

Finally, it can be seen in FIGS. 3 and 5 that the upper open end 25 of the shielding 23 (compare FIG. 2) can be closed by a cover 62 consisting substantially of a plastic plate 63. The plastic plate 63 which is itself electrically non-conductive, is provided with conductive paths 64 which, as appears from FIG. 5, extend radially in a star-shaped pattern. The conductive paths 64 are connected at the outer edge with the electrically conductive housing 30 through soldering points 65 and extend from the said outer edge towards the center without, however, actually reaching the center or contacting each other.

If one regards the right half of FIG. 2 in connection with FIG. 5, one will note immediately that the conductive paths 64 act to short-circuit any electric flux lines E of the leakage field that may extend outwardly of the shielding 23. The cover 62 with its conductive paths 64 therefore ensures that practically no electric leakage field is encountered above the application plane 27.

The measuring head 12 which has just been described in detail may be employed in different manners.

The basic measuring method consists in introducing the sample 11 into the magnet system 10—as shown in FIG. 1—and applying the measuring head 12. The magnetic flux lines B corresponding to the left half of FIG. 2 then enter the sample 11 and generate nuclear resonances provided they extend transversely to the direction of the coordinate z. Different nuclear species can be excited by suitably adjusting the ratio between the strength of the constant magnetic field and the irradiated measuring frequency.

Due to the nuclear resonance obtained, a signal voltage is received in the RF circuit of the measuring head 12, amplified in the receiving circuit by the input amplifier 36 of the electronic system 32, and transformed into corresponding spectum signals—a process which is known as such.

By adjusting the attenuator 35 the intensity distribution of the magnetic RF field within the sample 11 can now be adjusted in such a manner that the strength of the magnetic RF field at which the measured spins are deflected by exactly 90° is obtained in the sample 11 at a specific depth d beneath the application plane 27. This shows that the measuring plane can be selected in the direction of the coordinate d by adjusting the attenuator 35.

Another measuring method consists in trimming the measuring head by means of the tuning arrangements 38, 50 and 55 so that it is capable of resonating at a higher frequency corresponding for example to protons and also at a lower measuring frequency corresponding for example to $C^{13}$.

Then, the measuring head is placed on the sample 11, and a proton resonance is excited. The high intensity of proton signals makes it possible to observe the spectrum after every excitation. Means for homogenizing the constant magnetic field—which are not shown in FIG. 1 and which consist of so-called shim coils with their power packs—permit the proton spectrum to be observed and the constant magnetic field to be re-adjusted simultaneously to reduce the linewidth of the proton spectrum to its minimum at which a particularly good homogeneity of the constant magnetic field is obtained. Now, the electronic system 32 is switched over to a low measuring frequency corresponding to the nuclear species $C^{13}$, while keeping the measuring head 12 in its operative position on the sample 11. Accordingly, the $C^{13}$ measurement is carried out under exceptionally good homogeneity conditions.

A still further measuring method may consist in applying the measuring head 12—in FIG. 1—on the sample 11 in the simultaneous presence of RF saddle coils. The magnetic flux lines of the constant magnetic field, of the RF field of the measuring head 12, and of the RF field of the saddle coils extend in this case transversely relative to each other. Now a decoupling field, for example for protons, may be irradiated upon the sample 11 by means of the RF saddle coils, while the measuring head 12 records at the same time for example a (proton-decoupled) $C^{13}$ nuclear resonance spectrum. Due to the fact that the different RF field directions of the decoupling field on the one hand and the measuring field on the other hand extend transversely relative to each other, disturbing radiation from the RF saddle coil into the measuring head 12 of the invention is particularly low, and this also because the substantially all-round shielding 23 ensures additionally strict separation of the decoupling circuit from the measuring circuit.

I claim:

1. A measuring head for high-resolution nuclear resonance measurements in defined areas of organic tissue of human or animal bodies (11) which are exposed to a homogenous magnetic field, comprising an RF transmitter and receiver unit suitable for being applied upon the body (11), characterized in that the device takes the form of a helical line (20) with a coaxial shielding (23), that the shielding (23) is open on at least one end (25) and the other end of the helical line (20) is free of any connections, and that finally the uppermost winding (21) of the helical line (20) which is connected with the shielding (23) via a connection (28) is located substantially in the plane of the upper open end (25) where it forms the application plane (27).

2. A measuring head according to claim 1, characterized in that the other end (26) of the shielding (23) is closed so that the measuring head (12) forms a $\lambda/4$ resonator.

3. A measuring head according to claim 1, characterized in that the open end (25) forming the application plane (27) is covered by a cover (62) of an electrically non-conductive material, the cover (62) being provided with a plurality of radially extending conductive paths (64) whose outer ends end in a housing (30) forming the shielding (23) while their inner ends meet at the center of the cover (62) without, however, contacting each other.

4. A measuring head according to claim 2, characterized in that a first tuning arrangement (38) is provided in which the electric distance $h_1$ between the free end (43) of the helical line (20) and the other end (26) of the closed coaxial shielding (23) can be varied.

5. A measuring head according to claim 4, characterized in that the first tuning arrangement (38) consists of a bottom (39) which corresponds to the radial cross-sectional shape of the shielding (23), which is provided with a conductive coating (40) and which can be screwed into a housing (30) forming the shielding (23).

6. A measuring head according to claim 1, characterized in that a further tuning arrangement (50, 55) is provided in which the electric field E generated by the helical line (20) is loaded at an axially defined point where a maximum of the electric field E occurs only at a pre-determined oscillation mode.

7. A measuring head according to claim 6, characterized in that a second tuning arrangement (50) is provided between the helical line (20) and the shielding (23), the second tuning arrangement (50) consisting of an electrically conductive lug (51) whose one end (52) is connected with a housing (30) forming the shielding (23) and whose other end can be radially deflected.

8. A measuring head according to claim 6, characterized in that a third tuning arrangement (55) is provided in the interior of the helical line (20).

9. A measuring head according to claim 8, characterized in that the third tuning arrangement (55) consists of an open loop (56) whose plane extends transversely to the axis of the helical line (20) and which has its one end connected with a housing (30) forming the shielding (23).

10. A measuring head according to claim 1, characterized in that a fourth tuning arrangement (60) is provided in the connection (28) between the helical line (20) and the shielding (23).

11. A measuring head according to claim 10, characterized in that the fourth tuning arrangement (60) is formed by a variable capacitor.

12. A measuring head according to claim 1, characterized in that the helical line (20) is connected to an RF transmitter (34) of variable amplitude.

13. A method for recording high-resolution nuclear resonance signals in defined areas of organic tissue of human or animal bodies (11) which are exposed to a homogenous constant magnetic field, characterized by the steps of placing on the body (11) a measuring head (12) according to any of claims 1 to 12, exciting at first in the helical line (20) an oscillation mode of a higher frequency at which proton resonances are obtained, optimizing the homogeneity of the constant magnetic field while observing one line of a nuclear resonance spectrum of protons, and exciting thereafter an oscillation mode of a lower frequency at which nuclear resonances of other nuclear species, in particular of $C^{13}$, $P^{31}$, $Na^{23}$, occur, and measuring finally the nuclear resonance signal of the other nuclear species.

14. A method for recording high-resolution nuclear resonance signals in defined areas of organic tissue of human or animal bodies (11) which are exposed to a homogenous constant magnetic field, characterized by the steps of placing on the body (11) a measuring head (12) according to any of claims 1 to 12, irradiating upon the area by means of RF surface coils (saddle coils) a first RF field, in particular for exciting proton resonances, and placing the measuring head (12) upon the body (11) in vertical direction to the plane of the surface coils, in particular for measuring other nuclear species.

* * * * *